(12) United States Patent
Ershov

(10) Patent No.: US 10,493,504 B2
(45) Date of Patent: Dec. 3, 2019

(54) APPARATUS FOR AND METHOD OF ACTIVE CLEANING OF EUV OPTIC WITH RF PLASMA FIELD

(71) Applicant: ASML Netherlands B.V., Veldhoven (NL)

(72) Inventor: Alexander I. Ershov, San Diego, CA (US)

(73) Assignee: ASML NETHERLANDS B.V., Veldhoven (NL)

(*) Notice: Subject to any disclaimer, the term of this patent is extended or adjusted under 35 U.S.C. 154(b) by 210 days.

(21) Appl. No.: 15/373,199

(22) Filed: Dec. 8, 2016

(65) Prior Publication Data

US 2017/0095843 A1  Apr. 6, 2017

Related U.S. Application Data

(63) Continuation of application No. 14/218,707, filed on Mar. 18, 2014, now Pat. No. 9,539,622.

(51) Int. Cl.
*B08B 7/00* (2006.01)
*G02B 27/00* (2006.01)
(Continued)

(52) U.S. Cl.
CPC .......... *B08B 7/0035* (2013.01); *B08B 7/0057* (2013.01); *G02B 27/0006* (2013.01); *G03F 7/70033* (2013.01); *G03F 7/70883* (2013.01); *G03F 7/70925* (2013.01); *H01J 37/32091* (2013.01); *H01J 37/32174* (2013.01); *H01J 37/32339* (2013.01); *H01J 37/32651* (2013.01);
(Continued)

(58) Field of Classification Search
CPC . B08B 7/0035; B08B 7/0057; G02B 27/0006; G03F 7/70033; G03F 7/70883; G03F 7/70925; H01J 2237/327; H01J 2237/335; H01J 37/32091; H01J 37/32174; H01J 37/32339; H01J 37/32651; H01J 37/32715; H05G 2/003; H05G 2/008
See application file for complete search history.

(56) References Cited

U.S. PATENT DOCUMENTS 7,116,394 B2 * 10/2006 Bakker ..................... B08B 6/00
355/30
7,491,954 B2   2/2009 Bykanov et al.
(Continued)

FOREIGN PATENT DOCUMENTS

EP   1764653 A2   3/2007
JP   2006-165588 A   6/2006
(Continued)

OTHER PUBLICATIONS

International Search Report of PCT/EP2015/054558 dated Jun. 19, 2105.
(Continued)

*Primary Examiner* — Nadine G Norton
*Assistant Examiner* — Christopher Remavege
(74) *Attorney, Agent, or Firm* — Arent Fox LLP

(57) ABSTRACT

Apparatus for and method of cleaning an electrically conductive surface of an optical element in a system for generating extreme ultraviolet radiation in which electrically conductive surface is used as an electrode for generating a plasma which cleans the surface.

15 Claims, 4 Drawing Sheets

(51) Int. Cl.
  *G03F 7/20* (2006.01)
  *H01J 37/32* (2006.01)
  *H05G 2/00* (2006.01)

(52) U.S. Cl.
  CPC ....... *H01J 37/32715* (2013.01); *H05G 2/008* (2013.01); *H01J 2237/327* (2013.01); *H01J 2237/335* (2013.01); *H05G 2/003* (2013.01)

(56) References Cited

U.S. PATENT DOCUMENTS

| | | | | |
|---|---|---|---|---|
| 7,989,786 | B2* | 8/2011 | Smith | B82Y 10/00 |
| | | | | 250/365 |
| 8,075,732 | B2* | 12/2011 | Partlo | B08B 7/00 |
| | | | | 156/345.35 |
| 8,399,868 | B2* | 3/2013 | Jindal | B82Y 10/00 |
| | | | | 250/504 R |
| 9,680,277 | B2* | 6/2017 | Nowak | H01S 3/076 |
| 2009/0014027 | A1* | 1/2009 | Schriever | B08B 5/00 |
| | | | | 134/1.1 |
| 2010/0034349 | A1 | 2/2010 | Kraus et al. | |
| 2011/0140008 | A1* | 6/2011 | Bergstedt | H05G 2/008 |
| | | | | 250/504 R |
| 2011/0141865 | A1* | 6/2011 | Senekerimyan | G01J 1/429 |
| | | | | 369/47.15 |
| 2012/0313016 | A1* | 12/2012 | Fleurov | H05G 2/005 |
| | | | | 250/504 R |
| 2013/0141709 | A1 | 6/2013 | Loopstra et al. | |
| 2015/0188277 | A1* | 7/2015 | Nowak | H01S 3/076 |
| | | | | 359/342 |

FOREIGN PATENT DOCUMENTS

| | | | |
|---|---|---|---|
| JP | 2007-096297 | A | 12/2007 |
| JP | 2008-508722 | T | 3/2008 |
| JP | 2008-518480 | T | 5/2008 |
| JP | 2010-123929 | A | 3/2010 |
| JP | 2010-532554 | T | 7/2010 |
| JP | 2010-534946 | T | 11/2010 |
| JP | 2011-519156 | T | 6/2011 |
| JP | 2012-169580 | A | 6/2012 |
| JP | 2012-513653 | T | 6/2012 |
| WO | 2013007407 | A1 | 1/2013 |
| WO | 2013072154 | A1 | 5/2013 |

OTHER PUBLICATIONS

Japanese Office Action for corresponding JP 2016551259 dated Jan. 24, 2019.

* cited by examiner

APPARATUS FOR AND METHOD OF ACTIVE CLEANING OF EUV OPTIC WITH RF PLASMA FIELD

CROSS REFERENCE TO RELATED APPLICATION

This application is a Continuation of U.S. patent application Ser. No. 14/218,707 filed Mar. 18, 2014, the disclosure of this prior application is hereby incorporated in its entirety by reference.

FIELD

The present disclosure relates to extreme ultraviolet ("EUV") light sources that provide EUV light from a plasma that is created from a target material and collected and directed by an EUV optic to an intermediate region for utilization outside of the EUV light source chamber, e.g., by a lithography scanner/stepper.

BACKGROUND

Lithography is used in the fabrication of semiconductor devices. In lithography, a light-sensitive material, called a "photoresist," coats a wafer substrate, such as silicon. The photoresist may be exposed to light reflected from a mask to reproduce an image of the mask that is used to define a pattern on the wafer. When the wafer and mask are illuminated, the photoresist undergoes chemical reactions and is then developed to produce a replicated pattern of the mask on the wafer.

Extreme ultraviolet ("EUV") light, e.g., electromagnetic radiation having wavelengths of around 50 nm or less (also sometimes referred to as soft x-rays), and including light at a wavelength in a range of from about 11 nm to about 15 nm, 13.5 nm, can be used in photolithography processes to produce extremely small features in substrates such as silicon wafers. Here and elsewhere, it will be understood that the term "light" is used to encompass electromagnetic radiation regardless of whether it is within the visible part of the spectrum.

EUV light may be produced using a small, hot plasma which will efficiently radiate at the desired wavelength. The plasma may be created in a vacuum chamber, typically by driving a pulsed electrical discharge through the target material (discharge produced plasma or "DPP"), or by focusing a pulsed laser beam onto the target material (laser produced plasma or "LPP"). The target material preferably includes at least one element, e.g., xenon, lithium or tin, with one or more emission lines in the EUV part of the spectrum. The light produced by the plasma is then collected by nearby EUV optics such as mirrors and sent downstream to the rest of the lithography tool.

The hot plasma tends to erode materials nearby, e.g., the electrodes in electric-discharge sources or components of the gas delivery system in laser-produced plasmas. The eroded material may coat the EUV optics, resulting in a loss of reflectivity and reducing the amount of light available for lithography. Also, debris in the form of unvaporized target material can contaminate the surfaces of the EUV optics. It then becomes necessary to clean the surface of the EUV optic. One known technique for cleaning an EUV optic is to use a plasma generated with high frequency RF electric field, i.e., an RF plasma. The actual implementation of plasma cleaning, however, presents major technical challenges. Space constraints of a real LPP source make it very difficult to implement plasma cleaning without negatively affecting other source functions such as by causing undesirable reduction of the EUV collection angle or debris scattering from new components introduced to create the RF plasma.

With the above in mind, applicant discloses systems and methods for cleaning optics in a laser produced plasma EUV light source.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to one aspect, there is provided an EUV optical element having an electrically conductive surface and an electrically conductive member arranged adjacent and electrically coupled to the electrically conductive surface, the electrically conductive surface and the electrically conductive member being arranged with respect to each other such that a plasma is produced when RF power is supplied to the electrically conductive member, the plasma being capable of removing contaminants from at least a portion of the electrically conductive surface. The electrically conductive member is in sufficient proximity to the electrically conductive surface so as be able to couple RF energy to the electrically conductive surface and may even be in physical contact with the electrically conductive surface. A power supply including a radio frequency driver circuit may be electrically connected to the electrically conductive member.

The electrically conductive member may be plate-shaped and shaped to conform to a shape of the electrically conductive surface. The electrically conductive surface may be circular and have a central aperture, in which case the electrically conductive member may span a diameter of the electrically conductive surface except for the central aperture. The electrically conductive surface may also have an obscuration, in which case the electrically conductive member may be positioned within the obscuration.

The apparatus may also include a shield positioned such that the electrically conductive surface is interposed between the shield and the electrically conductive member. The shield may be electrically connected to ground.

According to another aspect, there is provided an electrically conductive mirror surface of an extreme ultraviolet radiation optical element, the mirror surface being circular and having a central aperture, and an electrode plate arranged adjacent to and electrically coupled to the mirror surface, the electrode plate conforming to a shape of an adjacent portion of the mirror surface and spanning the mirror surface except for the central aperture, the adjacent portion being an obscuration region of the mirror surface.

According to another aspect, there is provided a module for producing extreme ultraviolet radiation, the module comprising an RF driver circuit, an RF electrode comprising an electrically conductive surface of a collector mirror arranged to focus radiation from an EUV-producing plasma, and an electrically conductive member arranged in proximity to a portion of the electrically conductive surface, the electrically conductive member being electrically connected to the RF driver circuit and arranged to couple RF energy into the electrically conductive surface.

According to another aspect, there is provided a method of cleaning an electrically conductive mirror surface in an EUV light source, the electrically conductive surface having an attached electrically conductive member, the method comprising the steps of providing RF power to the electrically conductive member and coupling the RF power from the electrically conductive member to the electrically conductive mirror surface to produce a capacitively coupled RF plasma at the electrically conductive mirror surface to clean the electrically conductive mirror surface.

According to another aspect, there is provided an apparatus comprising an illumination system for producing a radiation beam, a support structure for supporting a patterning device in a path of the radiation beam, the patterning device imparting a pattern to the radiation beam, a substrate table for supporting a substrate, and a projection system adapted to project the pattern onto the substrate, the illumination system comprising an EUV optical element having an electrically conductive surface and an electrically conductive member arranged adjacent and electrically coupled to the electrically conductive surface, the electrically conductive surface and the electrically conductive member being arranged with respect to each other such that a plasma is produced when RF power is supplied to the electrically conductive member, the plasma being capable of removing contaminants from at least a portion of the electrically conductive surface.

DETAILED DESCRIPTION

Figure 1:
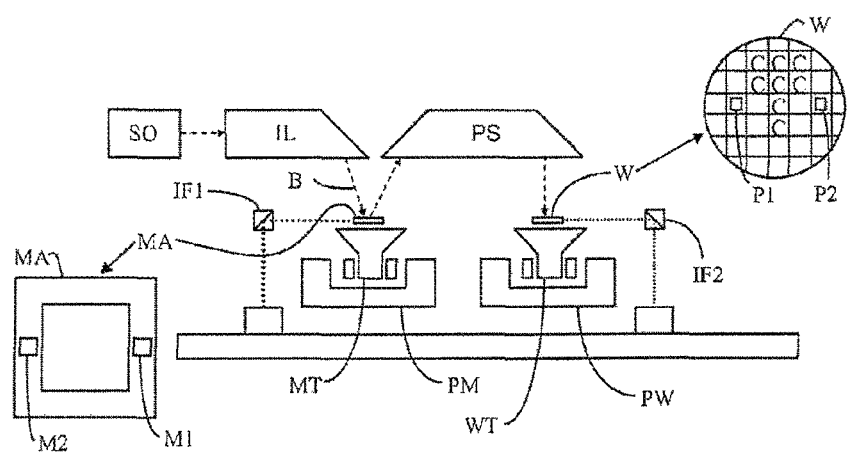
FIG. 1 shows a lithography system according to an embodiment of the invention.

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments.

FIG. 1 schematically depicts a lithographic apparatus according to an embodiment of the invention. The apparatus comprises an illumination system (illumination system) IL configured to condition a radiation beam B of radiation. The apparatus also includes a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive or reflective projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system.

Referring to FIG. 1, the illumination system IL receives a radiation beam from a radiation source SO. The source SO and the illumination system IL, together with the beam delivery system if required, may be referred to as a radiation system.

The illumination system IL may comprise an adjuster for adjusting the angular intensity distribution of the radiation beam. Generally, at least the outer and/or inner radial extent (commonly referred to as .sigma.-outer and .sigma.-inner, respectively) of the intensity distribution in a pupil plane of the illumination system can be adjusted. In addition, the illumination system IL may comprise various other components, such as an integrator and a condenser. The illumination system may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan.

Figure 2:
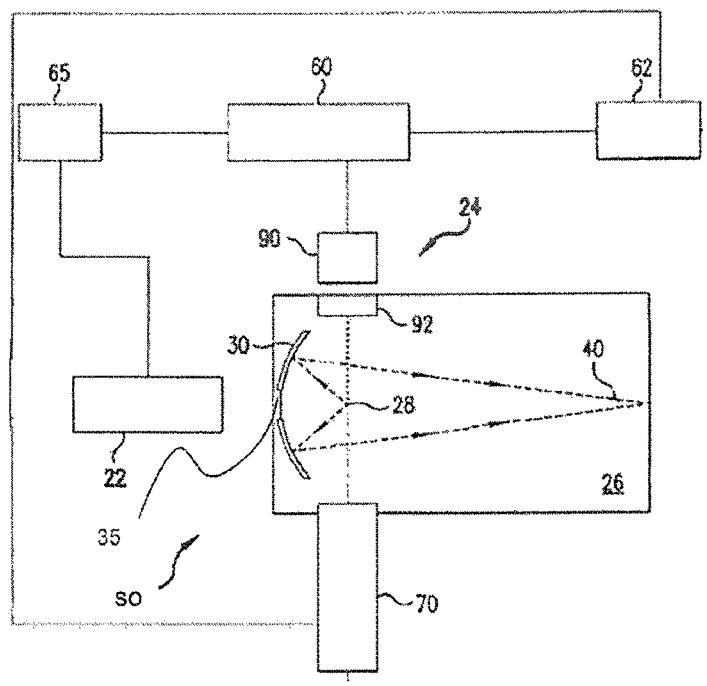
FIG. 2 shows an embodiment of radiation source such as could be used in the lithography system of FIG. 1.

FIG. 2 shows an embodiment of a source SO such as could be used in the apparatus of FIG. 1 in more detail. The source SO generates EUV radiation from a plasma which is formed at a plasma formation site or irradiation region 28. The plasma is created by directing a laser beam onto droplets of a suitable material such as Sn, In, Gd or some other material which are generated by a droplet generator 90. The laser beam causes the droplets to be vaporized, thereby generating the plasma. As mentioned, a source of this type may be referred to as a laser produced plasma or LPP source. The LPP light source SO may include a system 22 for generating a train of light pulses and delivering the light pulses into a chamber 26. As detailed below, each light pulse may travel along a beam path from the system 22 and into the chamber 26 to illuminate a respective target droplet at an irradiation region 28. It should be noted that as used herein an irradiation region is a region for source material irradiation to occur, and is an irradiation region even at times when no irradiation is actually occurring.

Suitable lasers for use in the system SO shown in FIG. 2 may include a pulsed laser device, e.g., a pulsed gas discharge $CO_2$ laser device producing radiation at 9.3 µm or 10.6 µm, e.g., with DC or RF excitation, operating at relatively high power, e.g., 10 kW or higher and high pulse repetition rate, e.g., 50 kHz or more. In one particular implementation, the laser may be an axial-flow RF-pumped $CO_2$ laser having an oscillator-amplifier configuration (e.g. master oscillator/power amplifier (MOPA) or power oscillator/power amplifier (POPA)) with multiple stages of amplification and having a seed pulse that is initiated by a Q-switched oscillator with relatively low energy and high repetition rate, e.g., capable of 100 kHz operation. From the oscillator, the laser pulse may then be amplified, shaped and/or focused before reaching the irradiation region 28. Continuously pumped $CO_2$ amplifiers may be used for the system SO. For example, a suitable $CO_2$ laser device having an oscillator and three amplifiers (O-PA1-PA2-PA3 configuration) is disclosed in U.S. Pat. No. 7,439,530, issued on Oct. 21, 2008, the entire contents of which are hereby incorporated by reference herein. Alternatively, the laser may be configured as a so-called "self-targeting" laser system in which the droplet serves as one mirror of the optical cavity. In some "self-targeting" arrangements, an oscillator may not be required. Self-targeting laser systems are disclosed and claimed in U.S. Pat. No. 7,491,954, issued on Feb. 17, 2009, the entire contents of which are hereby incorporated by reference herein.

Depending on the application, other types of lasers may also be suitable, e.g., an excimer or molecular fluorine laser operating at high power and high pulse repetition rate. Other examples include, a solid state laser, e.g., having a fiber, rod, slab or disk-shaped active media, other laser architectures having one or more chambers, e.g., an oscillator chamber and one or more amplifying chambers (with the amplifying chambers in parallel or in series), a master oscillator/power oscillator (MOPO) arrangement, a master oscillator/power ring amplifier (MOPRA) arrangement, or a solid state laser that seeds one or more excimer, molecular fluorine or $CO_2$ amplifier or oscillator chambers, may be suitable. Other designs may be suitable.

As further shown in FIG. 2, the EUV light source SO may also include a target material delivery system 24 delivering droplets of a target material into the interior of a chamber 26 to the irradiation region 28, where the droplets will interact with one or more light pulses, e.g., zero, one or more pre-pulses and thereafter one or more main pulses, to ultimately produce a plasma and generate an EUV emission. The EUV emitting element, e.g., tin, lithium, xenon, etc., may be in the form of liquid droplets and/or solid particles contained within liquid droplets. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the target material may be presented to the irradiation region 28 at various temperatures including room temperature or near room temperature (e.g., tin alloys, $SnBr_4$), at an elevated temperature, (e.g., pure tin) or at temperatures below room temperature, (e.g., $SnH_4$), and in some cases, can be relatively volatile, e.g., $SnBr_4$. More details concerning the use of these materials in an LPP EUV light source is provided in U.S. Pat. No. 7,465,946, issued on Dec. 16, 2008, the entire contents of which are hereby incorporated by reference herein. In some cases, an electrical charge is placed on the target material to permit the target material to be steered toward or away from the irradiation region 28.

Continuing with FIG. 2, the light source SO may also include one or more EUV optical elements such as EUV optic 30. The EUV optic 30 may be a collector mirror in the form of a normal incidence reflector, for example, implemented as a multilayer mirror (MLM), that is, a SiC substrate coated with a Mo/Si multilayer with additional thin barrier layers deposited at each interface to effectively block thermally-induced interlayer diffusion. Other substrate materials, such as Al or Si, can also be used. The EUV optic 30 may be in the form of a prolate ellipsoid, with an aperture 35 to allow the laser light to pass through and reach the irradiation region 28. The EUV optic 30 may be, e.g., in the shape of a ellipsoid that has a first focus at the irradiation region 28 and a second focus at a so-called intermediate point 40 (also called the intermediate focus 40) where the EUV light may be output from the EUV light source SO and input to, e.g., an integrated circuit lithography tool as described above.

As mentioned, the surface of the EUV optic becomes coated over time with residue from the LPP process including products of plasma erosion of components, unvaporized target material, and other potential sources of contamination. It is thus necessary to make provision for cleaning the EUV optic 30, preferably in situ. It is known to use an RF plasma to etch the contamination from the surface of the EUV optic 30, but in practice the introduction of additional components to create the RF plasma causes additional problems as outlined above. It is thus desirable to be able to implement plasma cleaning with a minimum of additional components. This is achieved in the present invention by using the electrically conductive surface of the EUV optic 30 itself as an electrode for a system for generating a capacitively coupled RF plasma.

Figure 3:
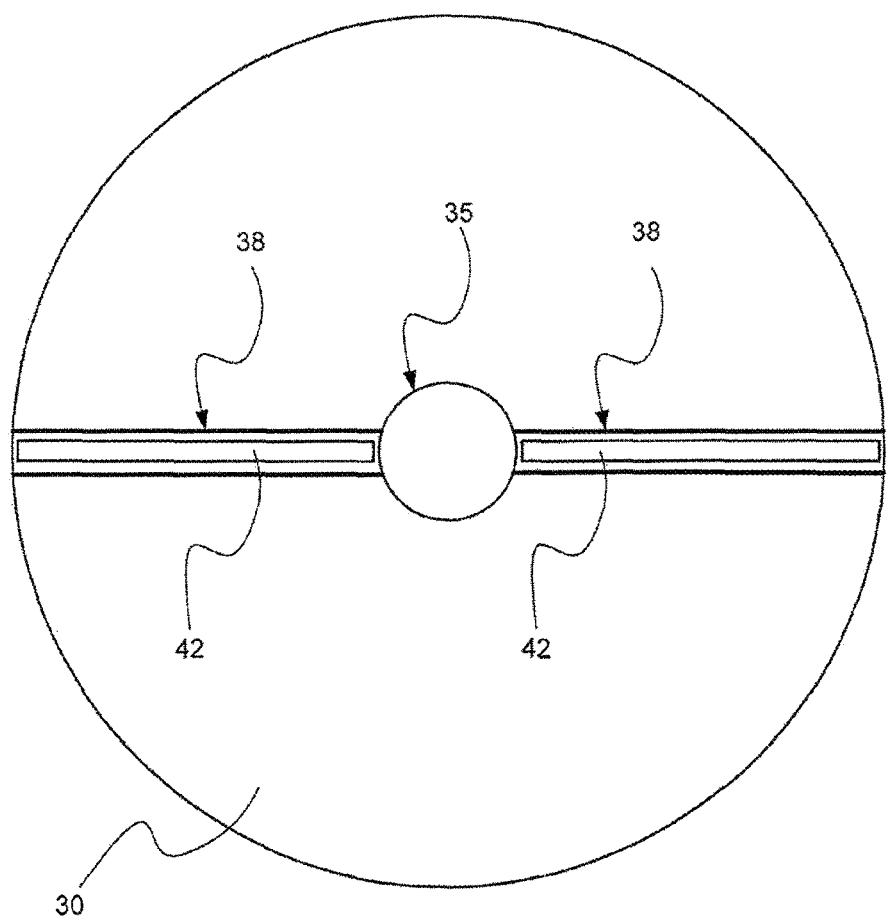
FIG. 3 shows an embodiment of an EUV optic such as could be used in the radiation source of FIG. 2.

Such an arrangement is shown in FIG. 3, which is a plan view of an EUV optic 30 according to a presently preferred embodiment of the invention. In the embodiment of FIG. 3 a collector mirror is used as an example of an EUV optic 30 but it will be understood by one of ordinary skill in the art the principles of the invention are applicable to other types of EUV optics as well. The EUV optic 30 has a central aperture 35 through which laser radiation passes on its way to the irradiation region 28 (not shown in FIG. 3). FIG. 3 also shows an obscuration region 38 of the EUV optic 30. In the embodiment of FIG. 3 the electrically conductive surface of the EUV optic 30 is used as an electrode far the generation of a capacitively coupled RF plasma that will clean contaminants from the surface of the EUV optic 30.

Accordingly, the embodiment depicted in FIG. 3 also includes an electrically conductive member for coupling RF power into the electrically conductive surface of the EUV optic 30. In the example of FIG. 3 the electrically conductive member is an electrode plate. It should be noted that although element 42 is referred to as an electrode plate, the term plate is used here generically to refer to a piece of conductive material regardless of shape. Preferably the electrode plate 42 is located in the portion of surface of the EUV optic 30 in the obscuration region 38. The electrode plate 42 preferably spans the obscuration region 38 except for the central aperture 35, which must be left open to permit the passage of the laser beam that produces the primary, EUV producing plasma.

Figure 4:
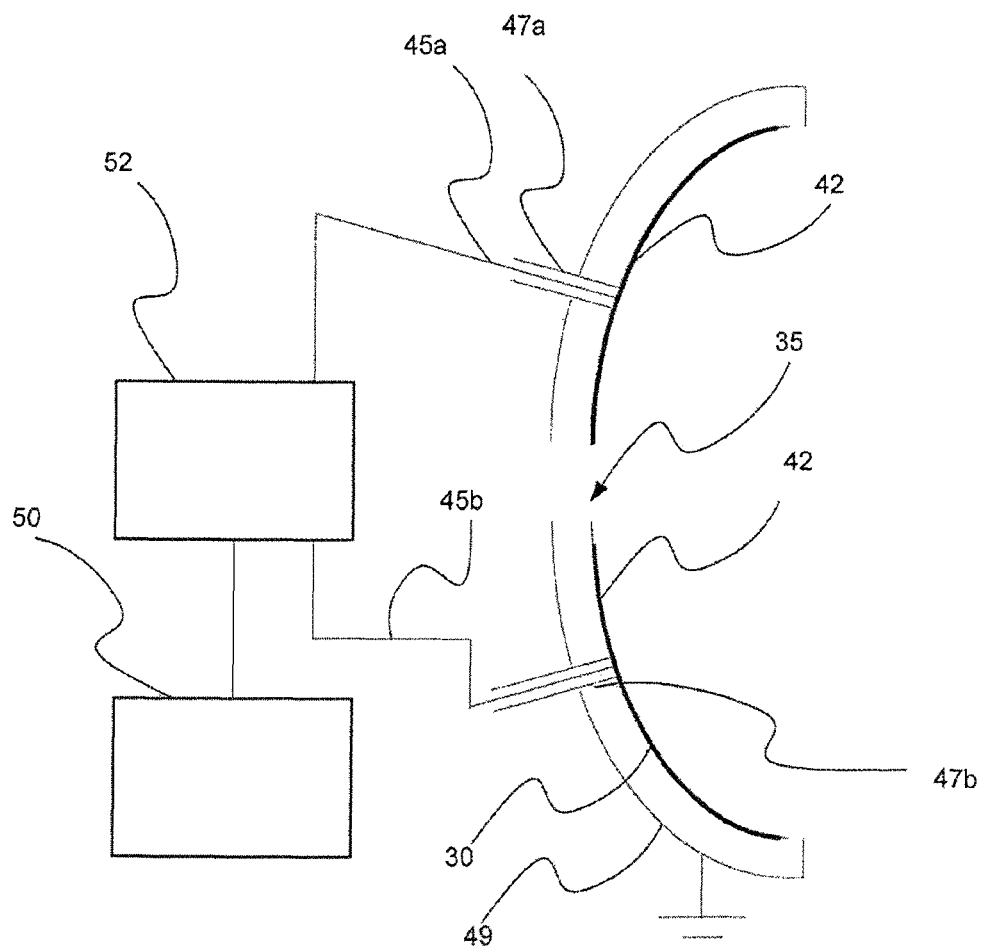
FIG. 4 also shows an embodiment of an EUV optic such as could be used in the radiation source of FIG. 2.

In this arrangement, the surface of the EUV optic 30 itself is used as a power electrode for producing a capacitively coupled plasma. As shown in FIG. 4, the RF power to the surface of the EUV 30 is fed through RF feeds 45. FIG. 4 also shows an RF power supply 50 and an RF matching network 52. In the case of an EUV optic embodied as a multilayer collector mirror the RF feeds 45 pass through apertures 47 in the collector substrate. Two such apertures are shown in FIG. 4 but any suitable number of such apertures may be used.

Each RF feed 45 goes through its respective aperture 47 and is connected to the electrode plate 42. The electrode plate 42 is preferably made out of suitable conductive material such as Mo, Cu, or Al. The electrode plate 42 is also preferably conformed to the shape of the surface of EUV 30 and preferably makes contact with the surface of the EUV optic 30. It should be noted, however, that the electrode plate 42 need not actually touch the electrically conductive surface of EUV optic 30. The electrode plate 42 need only be sufficiently proximate to the electrically conductive surface of EUV optic 30 to be able to couple RF power to the surface of the EUV optic 30.

The electrode plate 42 preferably spans the whole diameter of the EUV optic 30 with the exception of the central aperture 35. The thickness of the electrode plate 42 is preferably in the range of about 1 mm to about 20 mm. The width of the electrode plate 42 is preferably in the range of about 1 mm and 40 mm. Other dimensions of the electrode plate 42 are also possible. As mentioned, the electrode plate 42 is preferably located entirely within the horizontal obscuration of the EUV optic 30.

In use, the electrode plate 42 couples RF energy into the surface of the EUV optic 30 which is a good conductor for RF power. The surface of the EUV optic 30 then distributes the RF power over its entire area thus cleaning the surface of contaminants such as target material debris. The RF power supply preferably supplies an amount of power in the range of about 100 W to about 10000 W.

Also shown in FIG. 4 is a shield member 49. Shield member 49 is a grounded "dark" shield which is present to avoid striking a plasma in the area behind the EUV optic 30, that is, on the side of the BUY optic that does not face the irradiation region 28.

The above description includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. Apparatus comprising:
an extreme ultraviolet light optical element having a reflective electrically conductive surface which is circular, has a central aperture, and is arranged to focus radiation from an extreme ultraviolet light-producing plasma; and
an electrically conductive member arranged adjacent and electrically coupled to the electrically conductive surface, the electrically conductive member spanning a diameter of the electrically conductive surface except for the central aperture,
the electrically conductive surface and the electrically conductive member being arranged with respect to each other such that a plasma is produced when RF power is supplied to the electrically conductive member, the plasma being capable of removing contaminants from at least a portion of the electrically conductive surface.

2. Apparatus as claimed in claim 1 wherein the electrically conductive member is in sufficient proximity to the electrically conductive surface so as be able to couple RF energy to the electrically conductive surface.

3. Apparatus as claimed in claim 1 wherein the electrically conductive member is in physical contact with the electrically conductive surface.

4. Apparatus as claimed in claim 1 further comprising a power supply electrically connected to the electrically conductive member, the power supply comprising a radio frequency driver circuit.

5. Apparatus as claimed in claim 1 wherein the electrically conductive member is plate-shaped.

6. Apparatus as claimed in claim 1 wherein the electrically conductive member conforms to a shape of the electrically conductive surface.

7. Apparatus as claimed in claim 1 wherein the electrically conductive surface has an obscuration and the electrically conductive member is positioned within the obscuration.

8. Apparatus as claimed in claim 1 wherein extreme ultraviolet light optical element comprises an electrically insulating substrate and an electrically conducting surface.

9. Apparatus as claimed in claim 1 further comprising a shield positioned such that the electrically conductive surface is interposed between the shield and the electrically conductive member.

10. Apparatus as claimed in claim 9 wherein the shield is electrically connected to ground.

11. Apparatus as claimed in claim 1 wherein the electrically conductive member comprises at least one plate.

12. Apparatus as claimed in claim 5 wherein the electrically conductive member comprises at least one plate.

13. A module for producing extreme ultraviolet radiation, the module comprising:
an RF driver circuit;
an RF electrode comprising a reflective electrically conductive surface of a collector mirror, the electrically conductive surface being arranged to focus radiation from an extreme ultraviolet light-producing plasma, the electrically conductive surface being circular and having a central aperture and
an electrically conductive member arranged in proximity to a portion of the electrically conductive surface, the electrically conductive member being electrically connected to the RF driver circuit and arranged to couple RF energy into the electrically conductive surface, the electrically conductive member spanning a diameter of the electrically conductive surface except for the central aperture.

14. A method of cleaning an electrically conductive mirror surface in an extreme ultraviolet light source, the electrically conductive surface being arranged to focus radiation from an extreme ultraviolet light-producing plasma, being circular, and having a central aperture, the method comprising the steps of:
- providing an electrically conductive member spanning a diameter of the electrically conductive surface except for the central aperture;
- providing RF power to the electrically conductive member; and
- coupling the RF power from the electrically conductive member to the electrically conductive mirror surface to produce a capacitively coupled RF plasma at the electrically conductive mirror surface to clean the electrically conductive mirror surface.

15. Apparatus comprising:
- an illumination system for producing a radiation beam;
- a support structure for supporting a patterning device in a path of the radiation beam, the patterning device imparting a pattern to the radiation beam;
- a substrate table for supporting a substrate; and
- a projection system adapted to project the pattern onto the substrate,
- the illumination system comprising an extreme ultraviolet light optical element having a circular electrically conductive surface with a central aperture and arranged to focus radiation from an extreme ultraviolet light-producing plasma and an electrically conductive member arranged adjacent and spanning a diameter of the electrically conductive surface except for the central aperture and electrically coupled to the electrically conductive surface, the electrically conductive surface and the electrically conductive member being arranged with respect to each other such that a plasma is produced when RF power is supplied to the electrically conductive member, the plasma being capable of removing contaminants from at least a portion of the electrically conductive surface.

* * * * *